United States Patent
Zhang et al.

(10) Patent No.: US 7,120,856 B2
(45) Date of Patent: Oct. 10, 2006

(54) LDPC CODE AND ENCODER/DECODER REGARDING SAME

(75) Inventors: Tong Zhang, Troy, NY (US); Keshab K. Parhi, Mission Viejo, CA (US)

(73) Assignee: Leanics Corporation, Maple Grove, MN (US)

( * ) Notice: Subject to any disclaimer, the term of this patent is extended or adjusted under 35 U.S.C. 154(b) by 560 days.

(21) Appl. No.: 10/670,018

(22) Filed: Sep. 24, 2003

(65) Prior Publication Data

US 2004/0057575 A1   Mar. 25, 2004

Related U.S. Application Data

(60) Provisional application No. 60/413,373, filed on Sep. 25, 2002.

(51) Int. Cl.
*G06F 11/00* (2006.01)
*H03M 13/00* (2006.01)

(52) U.S. Cl. .................................... 714/801

(58) Field of Classification Search ................ 714/801, 714/807
See application file for complete search history.

(56) References Cited

OTHER PUBLICATIONS

Richardson et al., THe capacity of low density parity check codes under message passing decoding, Feb. 2001, IEEE Trans. on Info. Theory, vol. 47, No. 2, pp. 599-618.*
Kurkoski et al. Joint message passing decoding of LDPC codes and parital response channels, Jun. 2002, IEEE trans. on Info. Theory, vol. 48, No. 6, pp. 1410-1422.*
Mehta et al. An FPGA implementation of the graph encoder-decoder for regular LDPC codes, Aug. 2002, www.google.com, pp. 1-18. printed Jun. 2, 2006.*

* cited by examiner

*Primary Examiner*—Shelly Chase

(57) ABSTRACT

A joint code-encoder-decoder design approach and circuit architecture design for (3,k)-regular LDPC coding system implementation. The joint design process relies on a high girth (2,k)-regular LDPC code construction. The decoder realizes partly parallel decoding. The encoding scheme only contains multiplications between sparse matrices and vector and multiplication between a very small dense matrix and vector.

19 Claims, 7 Drawing Sheets

$$\hat{H} = \begin{bmatrix} H_1 \\ H_2 \end{bmatrix} = \begin{bmatrix} I_{1,1} & I_{2,1} & 0 & \cdots & I_{k,1} & I_{1,2} & I_{2,2} & 0 & \cdots & I_{k,2} & \cdots & I_{1,k} & I_{2,k} & 0 & \cdots & I_{k,k} \\ P_{1,1} & P_{2,1} & \cdots & P_{k,1} & 0 & P_{1,2} & P_{2,2} & \cdots & P_{k,2} & 0 & \cdots & P_{1,k} & P_{2,k} & \cdots & P_{k,k} & 0 \end{bmatrix}$$

LDPC CODE AND ENCODER/DECODER REGARDING SAME

CROSS-REFERENCE TO RELATED APPLICATIONS

This application claims the benefit of U.S. Provisional Application No. 60/413,373, filed Sep. 25, 2002, which is incorporated herein by reference in its entirety.

STATEMENT REGARDING FEDERALLY-SPONSORED RESEARCH AND DEVELOPMENT

This invention was made with Government support under Grant No. DA/DAAG55-98-1-0315 and DA/DAAD19-01-1-0705, Disclosure Z02232, awarded by the Army Research Office. The Government has certain rights in this invention.

FIELD OF THE INVENTION

The present invention relates to data transmission. More particularly, it relates to error-correcting codes for data transmission.

BACKGROUND OF THE INVENTION

Codes on graphs have become a topic of great current interest in the coding the-ory community. The prime examples of codes on graphs are low-density parity-check (LDPC) codes that have been widely considered as next-generation error-correcting codes for many real world applications in digital communication and magnetic storage. However, because of their distinct properties, LDPC codes decoder/encoder design and implementation are not trivial and design of these codes stills remain a challenging task. How well one attacks this problem directly determines the extent of LDPC application in the real world. As a class of LDPC codes, (3,k)-regular LDPC codes can achieve very good performance and hence are considered in this invention.

The main challenge when implementing the message passing algorithm for decoding LDPC codes is managing the passing of the messages. The realization of the message passing bandwidth results in very different and difficult challenges depending on whether all the messages are passed in fully parallel or partly parallel manner. By fully exploiting the parallelism of the message passing decoding algorithm, a fully parallel decoder can achieve very high decoding throughput but suffers from prohibitive implementation complexity (see, e.g., A. J. Blanksby and C. J. Howland, "A 690-mW 1-Gb/s 1024-b, rate-½ low-density parity-check code decoder", *IEEE Journal of Solid-State Circuits*, vol. 37, pp. 404–412 (March, 2002)). Furthermore, the large number of interconnection may limit the speed performance and increase the power dissipation. Thus the fully parallel design strategy is only suitable to short code length scenarios.

In partly parallel decoding, the computations associated with a certain number of variable nodes or check nodes are time-multiplexed to a single processor. Meanwhile, since the computation associated with each node is not complicated, the fully parallel interconnection network should be correspondingly transformed to partly parallel ones to achieve both the communication complexity reduction and high-speed partly parallel decoding. Unfortunately, the randomness of the Tanner graph makes it nearly impossible to develop such a transformation. In other words, an arbitrary random LDPC code has little chance to be suited for high-speed partly parallel decoder hardware implementation.

Furthermore, to perform LDPC encoding, the generator matrix is typically used, which has quadratic complexity in the block length. How to reduce the encoding complexity for the practical coding system implementation is another crucial issue.

What is needed is new joint code-encoder-decoder design methodology and techniques for designing practical LDPC coding system, that overcomes the limitations of the conventional code first scheme and/or designs.

BRIEF SUMMARY OF THE INVENTION

The present invention provides a joint code and decoder design approach to construct good (3,k)-regular LDPC codes that exactly fit to partly parallel decoder and efficient encoder implementations. A highly regular partly parallel decoder architecture design is developed. A systematic efficient encoding scheme is presented to significantly reduce the encoder implementation complexity.

In accordance with the present invention, LDPC coding system is designed using a joint code-encoder-decoder methodology. First a method is developed to explicitly construct a high-girth (girth is the length of a shortest cycle in a graph) (2,k)-regular LDPC code that exactly fits to a high-speed partly parallel decoder. Then this (2,k)-regular LDPC decoder is extended to a (3,k)-regular LDPC partly parallel decoder that is configured by a set of constrained random parameters. This decoder defines a (3,k)-regular LDPC code ensemble from which a good (3,k)-regular LDPC code can be selected based on the criterion of fewer short cycles and computer simulations. Due to certain unique structure properties of such (3,k)-regular LDPC codes, an efficient systematic encoding scheme is developed to reduce the encoding complexity. Since each code in such a code ensemble is actually constructed by randomly inserting certain check nodes into the deterministic high-girth (2,k)-regular LDPC code under the constraint specified by the decoder, the codes in this ensemble more likely do not contain too many short cycles and hence a good code can be easily selected from these codes.

The (3,k)-regular LDPC code-encoder-decoder design of the present invention can be used to design and implement LDPC coding system for a wide variety real-world applications that require excellent error-correcting performance and high decoding speed/low power consumption, such as deep space and satellite communication, optical links, and magnetic or holographic storage systems, etc. These codes can also be used for fixed and mobile wireless systems, ultra wide-band systems for personal area networks and other applications, and wireless local area networks containing wireless receivers with one or more antennas.

It is an advantage of the joint code-encoder-decoder design of the present invention that it effectively exploits the LDPC code construction flexibility to improve the overall LDPC coding system implementation performance.

Further embodiments, features, and advantages of the present invention, as well as the structure and operation of the various embodiments of the present invention are described in detail below with reference to accompanying drawings.

BRIEF DESCRIPTION OF THE DRAWINGS/FIGURES

The present invention is described with reference to the accompanying figures. In the figures, like reference numbers indicate identical or functionally similar elements. Additionally, the left-most digit or digits of a reference number identify the figure in which the reference number first appears. The accompanying figures, which are incorporated herein and form part of the specification, illustrate the present invention and, together with the description, further serve to explain the principles of the invention and to enable a person skilled in the relevant art to make and use the invention.

FIG. 2 illustrates the structures of submatrices $H_1$ and $H_2$.

FIG. 7 illustrates the structure of matrix $H^{en}$ for efficient encoding.

DETAILED DESCRIPTION OF THE INVENTION

Figure 1:
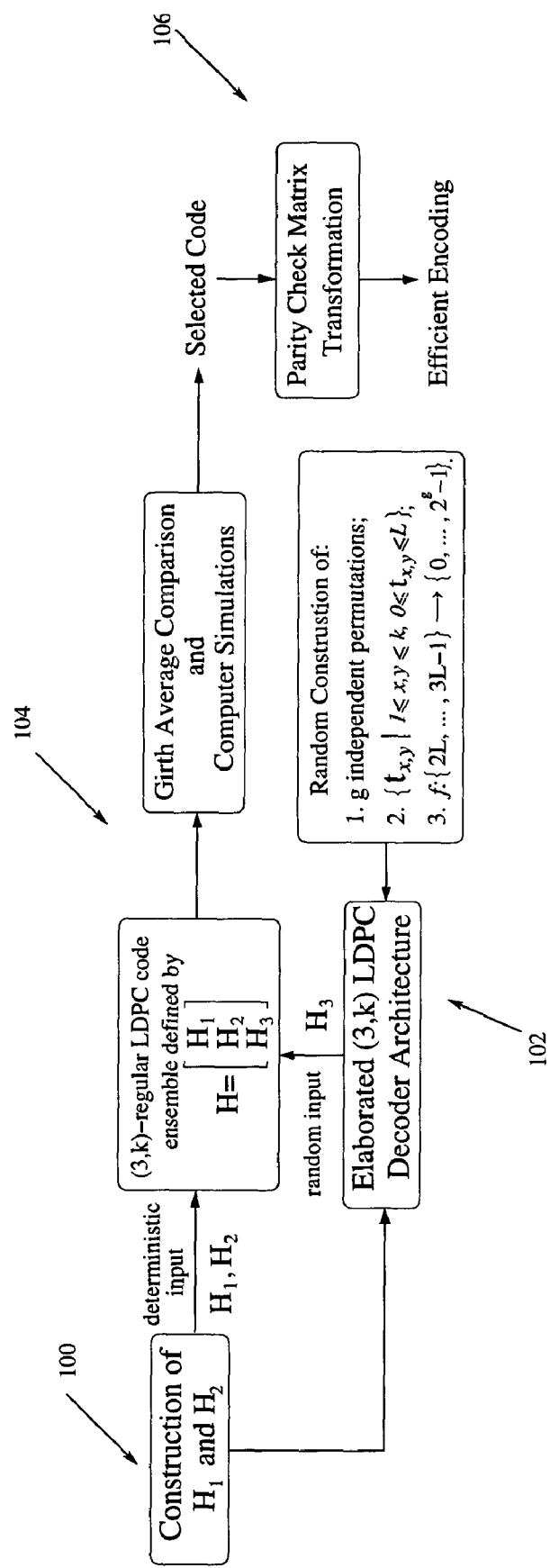
FIG. 1 illustrate the block diagram of a (3,k)-regular LDPC code and decoder/encoder joint design flow according to the invention.

Background on LDPC Code and Message Passing Decoding Algorithm

An LDPC code is defined as the null space of a very sparse M×N parity check matrix, and is typically represented by a bipartite graph (a bipartite graph is one in which the nodes can be partitioned into two disjoint sets) usually called a Tanner graph, between N variable (or message) nodes in one set and M check (or constraint) nodes in another set. An LDPC code is called (j, k)-regular if each variable node has a degree of j and each check node has a degree of k. The construction of an LDPC code (or its Tanner graph) is typically random. LDPC codes can be effectively decoded by the iterative message passing. The structure of the message passing decoding algorithm directly matches the Tanner graph: decoding messages are iteratively computed by all the variable nodes and check nodes and exchanged through the edges between the neighboring nodes. It is well known that the message passing decoding algorithm works well if the underlying Tanner graph does not contain too many short cycles. Thus, the random Tanner graph is typically restricted to be 4-cycle free, which is easy to achieve. However, the construction of random Tanner graphs free of higher order cycles, e.g., 6 and 8, is not trivial.

Before presenting the message passing algorithm, some definitions should be introduced first: Let H denote the M×N parity check matrix and $H_{i,j}$ denote the entry of H at the position (i, j). Define the set of bits n that participate in parity check m as $N(m)=\{n:H_{m,n}=1\}$, and the set of parity checks m in which bit n participates as $M(n)=\{m:H_{m,n}=1\}$. Let $N(m)\backslash n$ denote the set $N(m)$ with bit n excluded, and $M(n)\backslash m$ denote the set $M(n)$ with parity check m excluded.

Iterative message passing Decoding Algorithm
Input: The channel observations $p_n^0 = P(x_n=0)$ and $p_n^1 = P(x_n=1) = 1-p_n^0$, n=1, . . . , N;
Output: Hard decision $\hat{x} = \{\hat{x}_1, \ldots, \hat{x}_N\}$;

Procedure:
(a) Initialization: For each n, compute the channel message $$\gamma_n = \log \frac{p_n^0}{p_n^1}$$

and for each $(m,n) \in \{(i, j) | H_{i,j}=1\}$, compute $$\alpha_{m,n} = \text{sign}(\gamma_n) \log(\tanh(|\gamma_n|/2)), \quad \text{where sign}(\gamma_n) = \begin{cases} +1 & \gamma_n \geq 0 \\ -1 & \gamma_n < 0 \end{cases}.$$

(b) Iterative Decoding
Horizontal (or check node processing) step: For each $(m, n) \in \{(i, j) | H_{i,j}=1\}$, compute $$\beta_{m,n} = \log(\tanh(\alpha/2)) \prod_{n' \in N(m)\backslash n} \text{sign}(\alpha_{m,n'}), \qquad \text{EQ. (1)}$$

where $$\alpha = \sum_{n' \in N(m)\backslash n} |\alpha_{m,n'}|.$$

Vertical (or variable node processing) step: For each $(m, n) \in \{(i, j) | H_{i,j}=1\}$, compute $$\alpha_{m,n} = \text{sign}(\gamma_{m,n}) \log(\tanh(\gamma_{m,n}/2)), \qquad \text{EQ.(2)}$$

where $$\gamma_{m,n} = \gamma_n + \sum_{m' \in M(n)\backslash m} \beta_{m',n}.$$

For each n, update the "pseudo-posterior log-likelihood ratio (LLR)" $\lambda_n$ as:

$$\lambda_n = \gamma_n + \sum_{m \in M(n)} \beta_{m,n}. \qquad \text{EQ. (3)}$$

Decision step.
  i. Perform hard decision on $\{\lambda_1, \ldots, \lambda_N\}$ to obtain $\hat{x} = \{\hat{x}_1, \ldots, \hat{x}_N\}$ such that $\hat{x}_n=0$ if $\lambda_n>0$ and $\hat{x}_n=1$ if $\lambda \leq 0$;
  ii. If $H \cdot \hat{x} = 0$, then algorithm terminates, else go to Horizontal step. A failure will be declared if pre-set maximum number of iterations occurs without successful decoding.

In the above algorithm, $\alpha_{m,n}$ and $\beta_{m,n}$ are called variable-to-check messages and check-to-variable messages, respectively. Each check node computation is realized by a Check Node processing Unit (CNU) to compute the check-to-variable message $\beta_{m,n}$ according to EQ. (1), each variable node computation is realized by Variable Node processing Unit (VNU) to compute the variable-to-check message $\alpha_{m,n}$ and pseudo-posterior LLR $\lambda_n$ according to EQ. (2) and EQ. (3), respectively, and generate $\hat{x}_n$ by performing hard decision on $\lambda_n$.

Joint(3,k)-Regular LDPC Code and Decoder/Encoder Design

It is well known that the message passing algorithm for LDPC decoding works well if the underlying Tanner graph is 4-cycle free and does not contain too many short cycles. Thus the essential objective of this joint design approach is to construct LDPC codes that not only fit to practical decoder/encoder implementations but also have large average cycle length in their 4-cycle free Tanner graphs.

Given a graph G, let $g_u$ denote the length of the shortest cycle that passes through node u in graph G, then $$\sum_{u \in G} g_u / N$$

is denoted as girth average of G, where N=|G| is the total node number of G. Girth average can be used as an effective criterion for searching good LDPC code over one code ensemble. FIG. 1 illustrates the schematic diagram of the joint design approach which is briefly described below.

(a) Step 100: Explicitly construct the two matrices, $H_1$ and $H_2$, so that $\tilde{H}=[H_1^T, H_2^T]^T$ defines a (2,k)-regular LDPC code denoted as $C_2$;

(b) Step 102: Obtain an elaborated (3,k)-regular LDPC decoder architecture which defines a random (3,k)-regular LDPC code ensemble and each code in this ensemble is a sub-code of $C_2$;

(c) Step 104: Use the decoder to randomly generate a certain number of (3,k)-regular LDPC codes from which one can select one code with good performance by girth average comparison and computer simulations;

(d) Step 106: Let H denote the parity check matrix of the selected code. Introduce an explicit column permutation $\pi_c$ to generate an approximate upper triangular matrix $H^{en}=\pi_c(H)$ based on which an efficient encoding scheme is obtained.

Construction of $H_1$ and $H_2$

A method is developed to construct matrix $\tilde{H}=[H_1^T, H_2^T]^T$ which defines a (2, k)-regular LDPC code with girth of 12. Such construction method leads to a very simple decoder architecture and provides more freedom on the code length selection: Given k, any code length that could be factored as $L \cdot k^2$ is permitted, where L can not be factored as $L=a \cdot b$, $\forall$ $a, b \in \{0, \ldots, k-1\}$.

FIG. 2 shows the structures of $H_1$ and $H_2$. Each block matrix $I_{x,y}$ in $H_1$ is an L×L identity matrix and each block matrix $P_{x,y}$ in $H_2$ is obtained by a cyclic shift of an L×L identity matrix. Let T denote the right cyclic shift operator where $T^i(U)$ represents right cyclic shifting matrix U by i columns, then $P_{x,y}=T^u(I)$ where $u=((x-1) \cdot y)$ mod L and I represents the L×L identity matrix, e.g., let L=5, x=3 and y=4, then $u=(x-1) \cdot y$ mod $L=8$ mod $5=3$, and $$P_{3,4} = T^3(I) = \begin{bmatrix} 0 & 0 & 0 & 1 & 0 \\ 0 & 0 & 0 & 0 & 1 \\ 1 & 0 & 0 & 0 & 0 \\ 0 & 1 & 0 & 0 & 0 \\ 0 & 0 & 1 & 0 & 0 \end{bmatrix}.$$

Clearly, matrix $\tilde{H}=[H_1^T, H_2^T]^T$ defines a (2, k)-regular LDPC code with $L \cdot k^2$ variable nodes and $2L \cdot k$ check nodes. Let G denote the corresponding Tanner graph. The proposed (2,k) code has the property that if L can not be factored as $L=a \cdot b$, where $a, b \in \{0, \ldots, k-1\}$, then the girth of G is 12 and there is at least one 12-cycle passing each check node.

(2,k)-Regular LDPC Decoder Architecture

Figure 3:
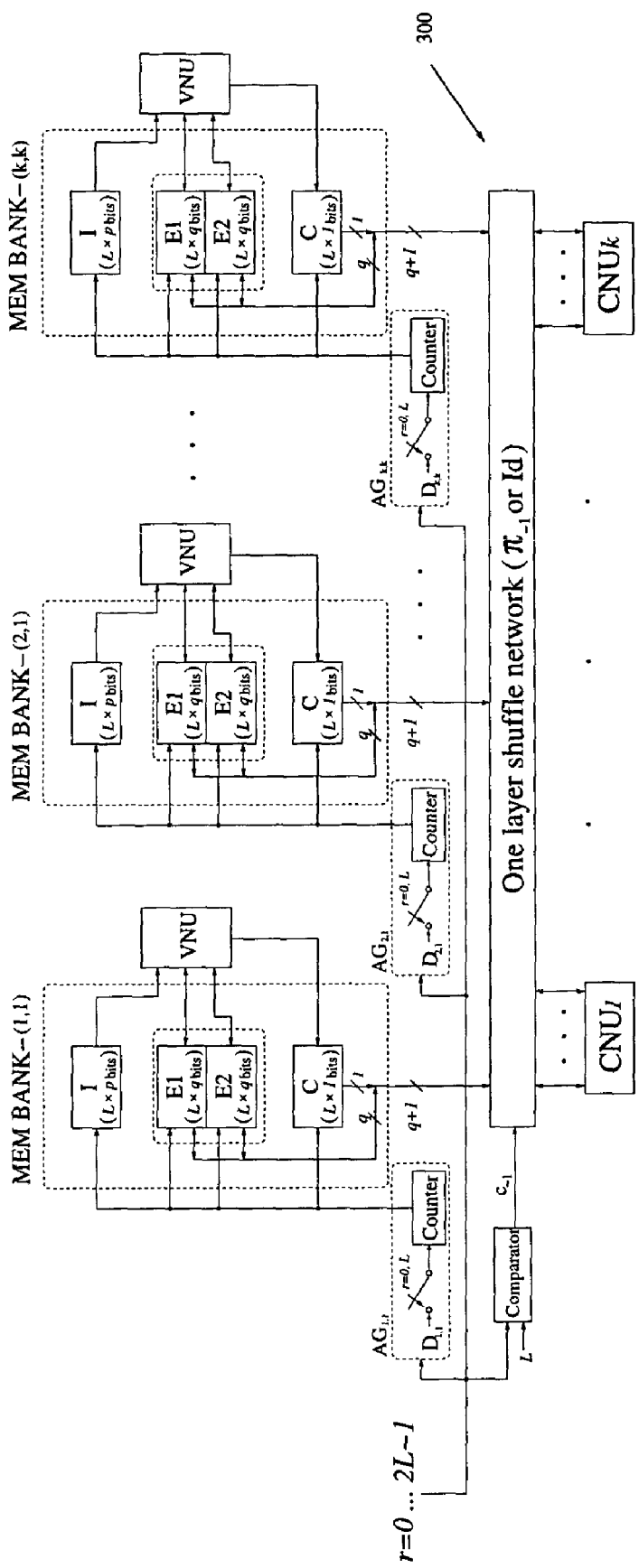
FIG. 3 illustrates the (2,k)-regular LDPC partly parallel decoder architecture.

A partly parallel decoder architecture is developed for the (2,k)-regular LDPC code constructed in the above. To facilitate the following description, $L \cdot k^2$ variable nodes of the code are arranged into $k^2$ variable node (VG) groups, each group $VG_{x,y}$ ($1 \leq x,y \leq k$) contains the L variable nodes corresponding to the L columns in $\tilde{H}$ going through the block matrix $I_{x,y}$ and $P_{x,y}$. Notice that any two variable nodes in the same group never connect to the same check node and all the k variable nodes connected to the same check node as specified by $H_1$ ($H_2$) always come from k groups with the same x-index (y-index). Based on the above observations, a partly parallel decoder architecture can be directly constructed, as shown in FIG. 3.

This decoder contains $k^2$ memory banks, denoted as MEM BANK-(x,y) for $1 \leq x,y \leq k$. MEM BANK-(x,y) stores all the p-bit channel messages in RAM (random access memory) I, q-bit variable-to-check and check-to-variable messages in RAMs $E_1$ and $E_2$ and hard decisions in RAM C associated with the L variable nodes in $VG_{x,y}$. In this decoder, the check-to-variable message $\beta_{m,n}$ and variable-to-check message $\alpha_{m,n}$ associated with each pair of neighboring nodes alternatively occupy the same memory location. The two check-to-variable or variable-to-check messages associated with each variable node are stored in $E_1$ and $E_2$ with the same address. This decoder completes each decoding iteration in 2L clock cycles, and in each clock cycle it performs:

(a) In each memory bank, if all the check-to-variable messages $\beta_{m,n}$ associated with one variable node become available after previous clock cycle, then
  i. Retrieve 1 channel message $\gamma_n$ from RAM I and 2 check-to-variable messages $\beta_{m,n}$ associated with this variable node from RAMs E1 and E2;
  ii. VNU computes 2 variable-to-check messages $\alpha_{m,n}$ and LLR $\lambda_n$, and obtains $\hat{x}_n$ by performing hard decision on $\lambda_n$;
  iii. Store the 2 variable-to-check messages $\alpha_{m,n}$ back to RAM E1 and E2 and $\hat{x}_n$ to RAM C.

(b) Retrieve $k^2$ variable-to-check messages $\alpha_{m,n}$ and hard decisions $\hat{x}_n$ (obtained in the previous iteration) from the $k^2$ memory banks at the addresses provided by $AG_i$'s;

(c) Shuffle the $k^2$ variable-to-check messages and hard decision by a one layer shuffle network 300. This shuffle network is configured by the configuration bit $c_{-1}$ leading to a fixed permutation (or re-ordering pattern), denoted by $\pi_{-1}$, if $c_{-1}$, =1, or to the identity permutation, denoted by Id, if $c_{-1}$=0.

(d) Each $CNU_i$ computes k check-to-variable messages $\beta_{m,n}$ and performs the parity check on the k hard decisions $\hat{x}_n$;

(e) Unshuffle the $k^2$ check-to-variable messages $\beta_{m,n}$ and store them back into the $k^2$ memory banks at the original locations.

To realize the connectivity specified by $H_1$ and $H_2$ in the $1^{st}$ and $2^{nd}$ L clock cycles, respectively, this decoder has the following features:

Each Address Generator ($AG_{x,y}$) provides memory address to E1 and E2 during the $1^{st}$ and $2^{nd}$ L clock cycles, respectively. Each $AG_{x,y}$ is a modulo-L binary counter which is set to initial value $D_{x,y}$ every L clock cycles, i.e., at r=0, L, where $$D_{x,y} = \begin{cases} 0, & r = 0, \\ ((x-1) \cdot y) \bmod L, & r = L. \end{cases} \quad \text{EQ. (4)}$$

During the $1^{st}$ L clock cycles, the configuration bit $c_{-1}$=1 and $\pi_{-1}$ permute input data $\{x_0, \ldots, x_{k^2-1}\}$ to $\{x_{\pi_{-1}(0)}, \ldots, x_{\pi_{-1}(k^2-1)}\}$, where $$\pi_{-1}(i) = (i \bmod k) \cdot k + \left\lfloor \frac{i}{k} \right\rfloor. \quad \text{EQ. (5)}$$

During the $2^{nd}$ L clock cycles, the configuration bit $c_{-1}$=0 and the shuffle network is bypassed.

(3,k)-Regular LDPC Decoder Architecture

Figure 4:
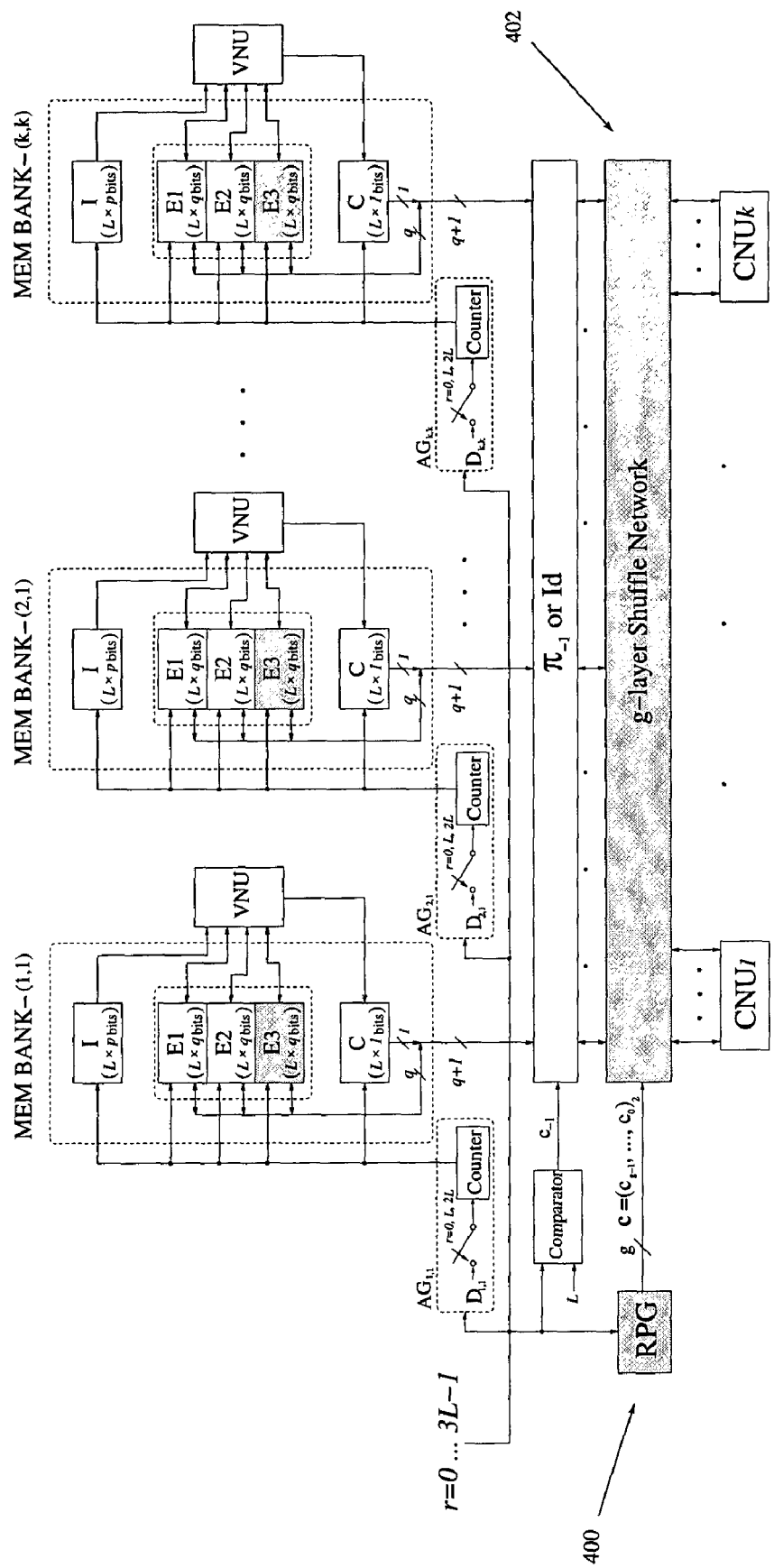
FIG. 4 illustrates the (3,k)-regular LDPC partly parallel decoder architecture.

FIG. 4 illustrates the (3,k)-regular LDPC partly parallel decoder obtained by introducing a few new blocks into the (2,k)-regular LDPC decoder. Configured by a set of constrained random parameters, this decoder defines a (3,k)-regular LDPC code ensemble in which each code has $L \cdot k^2$ variable nodes and $3L \cdot k$ check nodes.

Figure 5:
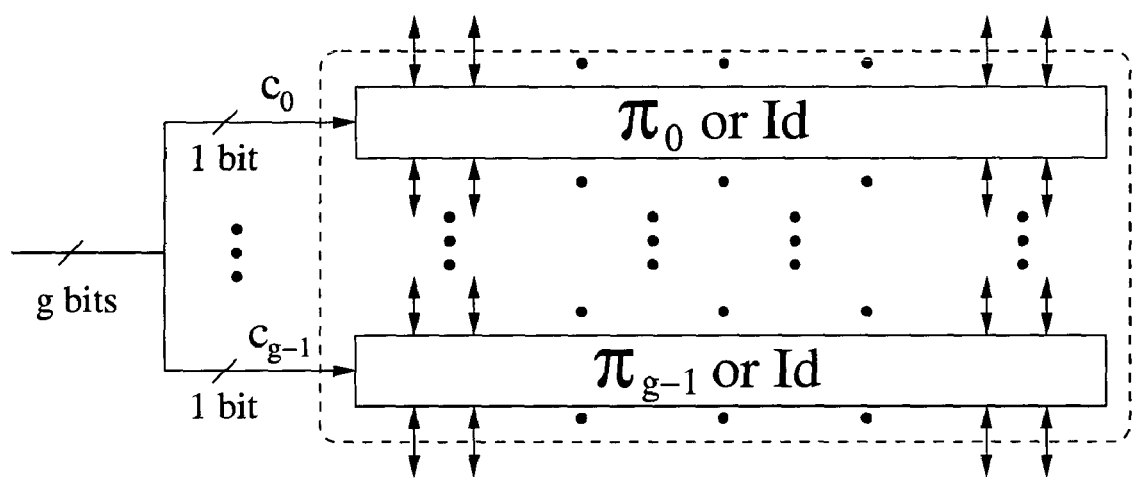
FIG. 5 illustrates the g-layer shuffle network.

In this decoder, a Random Permutation Generator (RPG) 400 and a g-layer shuffle network 402 are inserted between the 1-layer shuffle network ($\pi_{-1}$ or Id) and all the CNUs. FIG. 5 shows the structure of the g-layer shuffle network: each layer is a single layer shuffle network and configured by $c_i$ leading to a given permutation $\pi_i$ if $c_i$=1 ($\pi_i^1$), or to the identity permutation (Id=$\pi_i^0$) otherwise. Thus, configured by the g-bit word $c=(c_{g-1}, \ldots, c_0)2$ generated by RPG, the overall permutation pattern $\tilde{\pi}$ in each clock cycle is the product of g permutations:

$$\tilde{\pi} = \pi_{g-1}^{c_{g-1}} \circ \ldots \circ \pi_0^{c_0}.$$

This decoder completes each decoding iteration in 3L clock cycles. CNUs access the messages stored in E1, E2 and E3 in the $1^{st}$, $2^{nd}$ and $3^{rd}$ L clock cycles, respectively. Denote the $2L \cdot k$ check nodes associated with the messages stored in E1 and E2 as deterministic check nodes and the other $L \cdot k$ check nodes associated with the messages stored in E3 as random check nodes.

During the first 2L clock cycles, this decoder bypasses the g-layer shuffle network by setting the output of RPG as a zero vector, and works in the exactly same way as the (2,k)-regular LDPC decoder. In other words, this decoder realizes the connectivity specified by $\tilde{H}[H_1^T, H_2^T]^T$ between all variable nodes and the $2L \cdot k$ deterministic check nodes during the first 2L clock cycles.

During the last L clock cycles, this decoder realizes the connectivity between all variable nodes and the $L \cdot k$ random check nodes according to the following specifications.

RPG performs as a hash function f: $\{2L, \ldots, 3L-1\} \to \{0, \ldots, 2^g-1\}$ and its g-bit output vector c configures the grayer shuffle network;

The configuration bit $c_{-1}$=0 so that the 1-layer shuffle network performs the identity permutation;

$AG_{x,y}$ provides address to E3 with the counter set to $D_{x,y}$=$t_{x,y}$ at r=2L, where $t_{x,y} \in \{0, \ldots, L-1\}$.

In order to guarantee that this code ensemble only contains 4-cycle free codes and facilitate the design process, the hash function f and the g-layer shuffle network are generated randomly and the value of each $t_{x,y}$ is chosen randomly under the following constraints:

(a) Given x, $t_{x,y1} \neq t_{x,y2}$, $\forall y_2$, $y_2 \in \{1, \ldots, k\}$;

(b) Given y, $t_{x_1,y} - t_{x_2,y} \neq ((x_1-x_2) \cdot y) \bmod L$, $\forall x_1$, $x_2 \in \{1, \ldots, k\}$.

The code ensemble defined by the proposed decoder is referred as implementation-oriented (3,k)-regular LDPC code ensemble. For real applications, a good code is selected from this code ensemble by two steps: first randomly generate a certain number of implementation-oriented (3, k)-regular LDPC codes, then pick few codes with high girth averages and finally select the one leading to the best code performance simulation results.

One unique property of this work is to use the counter for memory address generation, which largely simplifies the decoder hardware implementation complexity and improves the throughput performance compared with the previous design solution (see, E. Boutillon and J. Castura and F. R. Kschischang, "Decoder-First Code Design", *proceedings of the 2nd International Symposium on Turbo Codes and Related Topics*, pp. 459–462 (September 2000)) in which more complex random number generators are used to generate the memory access address.

An Alternative (3,k)-Regular LDPC Decoder Architecture

Figure 6:
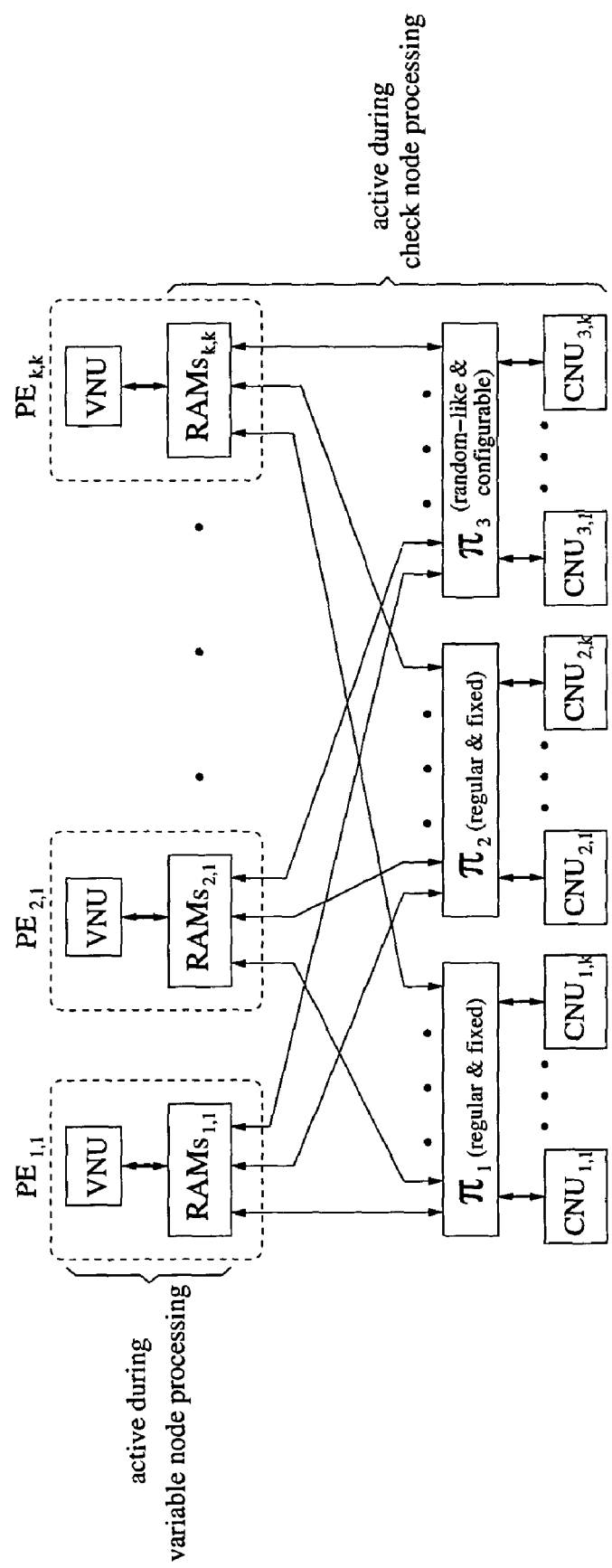
FIG. 6 illustrates the structure of an alternative (3,k)-regular LDPC partly parallel decoder

The architecture shown in FIG. 4 demands 3L clock cycles to complete one decoding iteration. As an alternative design solution, FIG. 6 shows the principal structure of a partly parallel decoder that requires only 2L clock cycles for one iteration. It mainly contains $k^2$ PE Blocks $PE_{x,y}$ for $1 \leq x,y \leq k$, three bi-directional shuffle networks $\pi_1$, $\pi_2$ and $\pi_3$ and $3 \cdot k$ CNU's. Each $PE_{x,y}$ contains one memory bank $RAMs_{x,y}$ that stores all the decoding information associated with all the L variable nodes in the variable node group $VG_{x,y}$, and contains one VNU to perform the variable node computations for these L variable nodes. Each bi-directional shuffle network $\pi_i$ realizes the decoding information exchange between all the $L \cdot k^2$ variable nodes and the $L \cdot k$ check nodes corresponding to $H_i$. The k $CNU_{i,j}$'s for j=1, . . . , k perform the check node computations for all the $L \cdot k$ check nodes corresponding to $H_i$.

This decoder completes each decoding iteration in 2L clock cycles, and during the $1^{st}$ and $2^{nd}$ L clock cycles, it works in check node processing mode and variable node processing mode, respectively. In the check node processing mode, the decoder not only performs the computations of all the check nodes but also completes the decoding information exchange between neighboring nodes. In variable node processing mode, the decoder only performs the computations of all the variable nodes.

Efficient Encoding Scheme

The straightforward encoding scheme for LDPC codes, using the generator matrix, has quadratic complexity in the block length, which is prohibitive with respect to implementation complexity. Based on the specific structure of the parity check matrix of the proposed (3,k)-regular LDPC codes, a systematic approach is proposed for its efficient encoding. The basic idea is: First obtain an approximate upper triangular matrix $H^{en}=\pi_c(H)$ by introducing an explicit column permutation $\pi_c$, and then obtain $\hat{x}$ by performing efficient encoding based on $H^{en}$, and finally get the codeword $x=\pi_c^{-1}(\hat{x})$.

Figure 7:
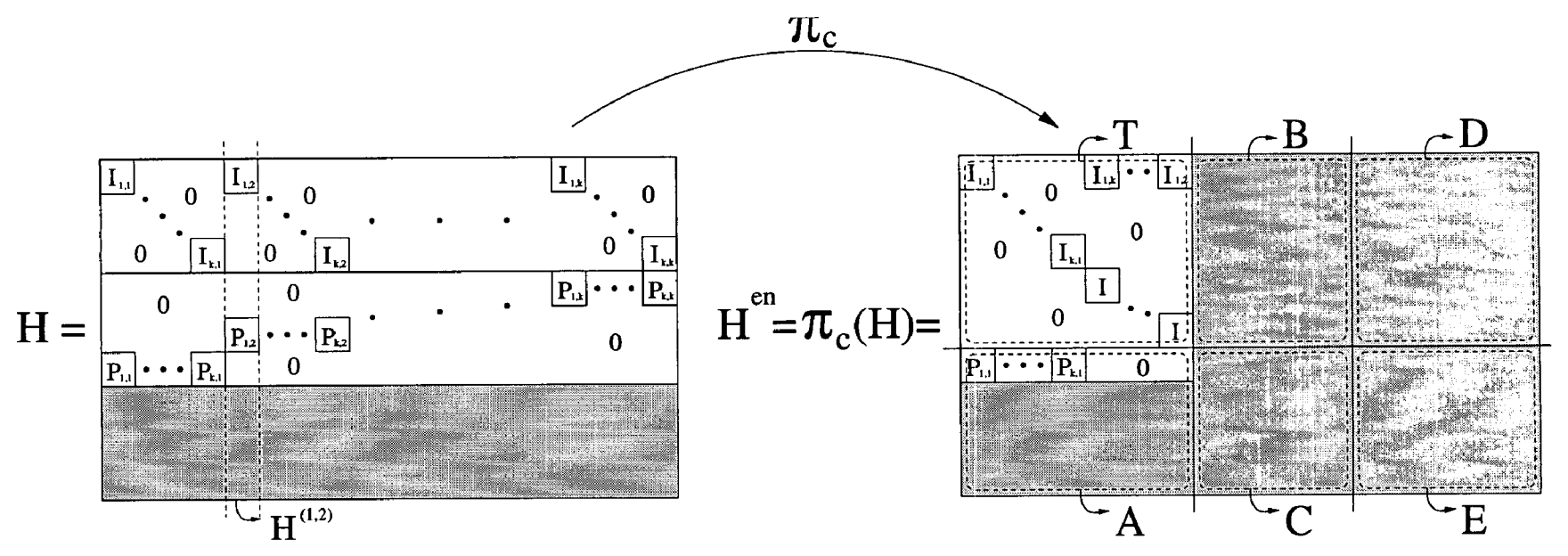

The parity check matrix of the developed (3,k)-regular LDPC code has the form: $H=[H_1^T, H_2^T, H_3^T]^T$, where $H_1$ and $H_2$ are shown in FIG. 2. The submatrix consisting of all the columns of H which go through the block matrix $I_{x,y}$ in $H_1$ is denoted as $H^{(x,y)}$, e.g., $H^{(1,2)}$ as shown in FIG. 7. A column permutation $\pi_c$ is introduced to move each $H^{(1,x)}$ forward to the position just right to $H^{(k,1)}$ where x increases from 3 to k successively. Because each $P_{1,y}$ is an identity matrix, the matrix $H^{en}=\pi_c(H)$ has the structure as shown in FIG. 7, based on which one can write matrix $H^{en}$ in block matrix form as:

$$H^{en} = \begin{bmatrix} T & B & D \\ A & C & E \end{bmatrix}.$$ EQ.(6)

The efficient encoding is carried out based on the matrix $H^{en}$. Let $\hat{x}=(\hat{x}_a, \hat{x}_b, \hat{x}_c)$ be a tentative codeword decomposed according to (6), where $\hat{x}_c$ contains the information bits of length N−M+r; redundant bits $\hat{x}_a$ and $\hat{x}_b$ are of length (2k−1)·L and (k+1)·L−r, respectively. The encoding process is outlined as follows:
(a) Compute $y_c=D·\hat{x}_c$ and $z_c=E·\hat{x}_c$, which is efficient because both D and E are sparse;
(b) Solve $T·\hat{x}'_a=y_c$. Since T has the form as shown in FIG. 7, it can be proved that $T^{-1}=T$. Thus $\hat{x}'_a=T·y_c$, which can be easily computed since T is sparse;
(c) Evaluate $\hat{s}=A·\hat{x}'_a+z_c$, which is also efficient since A is sparse;
(d) Compute $\hat{x}_b=G·\hat{s}$, where $G=(A·T·B+C)^{-1}$. In this step, the complexity is proportional to $((k+1)·L-r)^2$;
(e) Finally one can obtain $\hat{x}_a$ by solving $T·\hat{x}_a=B·\hat{x}_b+y_c$. Since $T^x_a=T·(B·\hat{x}_b+y_c)$. This is efficient since both T and B are sparse.

The real codeword is obtained as $x=\pi_c^{-1}(\hat{x})$. The information bits on the decoder side can be easily obtained by performing the column permutation $\pi_c$ on the decoder output.

CONCLUSIONS

A joint (3,k)-regular LDPC code and decoder/encoder design approach has been presented. By jointly considering the good LDPC code construction and practical decoder/encoder VLSI implementation, this successful attacks the practical (3,k)-regular LDPC coding system design and implementation problems for real-world applications. It will be understood by those skilled in the art that various changes in form and details can be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. An integrated circuit that implements a (2,k)-regular low-density parity check code decoder with the functionality of 2Lk check node functions and $Lk^2$ variable node functions, comprising:
(a) $k^2$ random access memories (RAMs),
(b) $k^2$ variable node units, wherein one variable node unit is coupled to one RAM,
(c) a bidirectional shuffle network connected to the said $k^2$ RAMs,
(d) k check node units connected to the said shuffle network, and
(e) $k^2$ modulo-L counters, wherein each modulo-L counter is an address generator for one RAM.

2. The integrated circuit of claim 1, wherein the variable node unit retrieves a channel message and 2 check-to-variable messages from the RAM to which it is coupled, and computes 2 variable-to-check messages, and stores the said messages in the RAMs, in every clock cycle.

3. The integrated circuit of claim 1, wherein k check node units retrieve $k^2$ variable-to-check messages from the RAMs after shuffling, compute $k^2$ check-to-variable messages, and store them back in the RAMs after unshuffling.

4. The integrated circuit of claim 1, wherein the shuffle network performs permutations in first L cycles, and performs no permutations in next L cycles.

5. The integrated circuit of claim 1, wherein k check node units retrieve $k^2$ variable-to-check messages from the RAMs after shuffling, compute $k^2$ check-to-variable messages, and store them back in the RAMs after unshuffling.

6. An integrated circuit that implements a (3,k)-regular low-density parity check code decoder with the functionality of 3Lk check node functions and $Lk^2$ variable node functions, comprising:
(a) $k^2$ random access memories (RAMs),
(b) $k^2$ variable node units, wherein one variable node unit is coupled to one RAM,
(c) a first bidirectional shuffle network that is connected to the said RAMs,
(d) a second bidirectional shuffle network coupled to the first bidirectional shuffle network, wherein the permutations performed by the second shuffle network are controlled by a g-bit word,
(e) a random pattern generator which is coupled to the said second shuffle network wherein the random pattern generator generates the g-bit word to control the permutations in the second shuffle network,
(f) k check node units connected to the said second shuffle network, and
(g) $k^2$ modulo-L counters, wherein each modulo-L counter is an address generator for one RAM.

7. The integrated circuit of claim 6, wherein the variable node unit retrieves a channel message and 2 check-to-variable messages from the RAM to which it is coupled, and computes 2 variable-to-check messages, and stores the said messages in the RAMs.

8. The integrated circuit of claim 6, wherein the first shuffle network performs permutations in the first L clock cycles and performs no permutations in second and third L clock cycles.

9. The integrated circuit of claim 6, wherein the second shuffle network performs no permutations in first and second L clock cycles, and performs permutations in 3rd L clock cycles.

10. The integrated circuit of claim 6, wherein the random pattern generator performs a hash function.

11. The integrated circuit of claim 6 as part of a wireless transceiver.

12. The integrated circuit of claim 6 as part of a storage system.

13. The integrated circuit of claim 6 as part of a communications receiver.

14. An integrated circuit that implements a (3,k)-regular low-density parity check code decoder with the functionality of 3Lk check node functions and $Lk^2$ variable node functions, comprising:
   (a) $k^2$ random access memories (RAMs),
   (b) $k^2$ variable node units, wherein one variable node unit is coupled to one RAM,
   (c) a first bidirectional shuffle network that is connected to the said RAMs, wherein the permutations performed by the shuffle network are regular and fixed,
   (d) a second bidirectional shuffle network that is connected to the said RAMs, wherein the permutations performed by the said shuffle network are regular and fixed,
   (e) a third bidirectional shuffle network that is connected to the said RAMs, wherein the permutations performed by the said shuffle network are random-like and configurable,
   (f) k check node units connected to the first shuffle network,
   (g) k check node units connected to the second shuffle network,
   (h) k check node units connected to the third shuffle network,
   (i) $k^2$ modulo-L counters, wherein each modulo-L counter is an address generator for one RAM.

15. The integrated circuit of claim 3, wherein the check node units compute check-to-variable messages in the first L cycles.

16. The integrated circuit of claim 14, wherein the variable node units compute variable-to-check messages in second L cycles.

17. The integrated circuit of claim 14 as part of a wireless system.

18. The integrated circuit of claim 14 as part of a storage system.

19. The integrated circuit of claim 14 as part of a communications receiver.

* * * * *